United States Patent
Kang

(10) Patent No.: US 10,890,843 B2
(45) Date of Patent: Jan. 12, 2021

(54) FAST IMPRINT LITHOGRAPHY

(71) Applicant: Tokyo Electron Limited, Tokyo (JP)

(72) Inventor: Hoyoung Kang, Guilderland, NY (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 16/046,272

(22) Filed: Jul. 26, 2018

(65) Prior Publication Data

US 2019/0033711 A1 Jan. 31, 2019

Related U.S. Application Data

(60) Provisional application No. 62/538,120, filed on Jul. 28, 2017.

(51) Int. Cl.
| | | |
|---|---|---|
| *G03F 7/00* | (2006.01) | |
| *H01L 21/302* | (2006.01) | |
| *H01L 21/027* | (2006.01) | |

(52) U.S. Cl.
CPC ........ *G03F 7/0002* (2013.01); *H01L 21/0273* (2013.01)

(58) Field of Classification Search
None
See application file for complete search history.

(56) References Cited

U.S. PATENT DOCUMENTS

| | | | | |
|---|---|---|---|---|
| 6,428,852 | B1* | 8/2002 | Pillion | B05D 3/00 118/50 |
| 2008/0146801 | A1* | 6/2008 | Kido | C07C 239/10 546/1 |
| 2009/0028910 | A1* | 1/2009 | DeSimone | A61K 9/0097 424/401 |
| 2009/0120904 | A1* | 5/2009 | Imada | B82Y 10/00 216/41 |
| 2010/0193994 | A1* | 8/2010 | Wuister | B82Y 10/00 264/293 |
| 2013/0216779 | A1* | 8/2013 | Hofmeister | G03F 7/0002 428/141 |
| 2014/0227882 | A1* | 8/2014 | Inai | H01L 21/02057 438/712 |
| 2015/0123300 | A1* | 5/2015 | Tanabe | G03F 7/0002 264/40.1 |
| 2018/0073245 | A1* | 3/2018 | Kim | B29C 45/0001 |
| 2018/0337379 | A1* | 11/2018 | Joo | H01M 2/166 |
| 2019/0212647 | A1* | 7/2019 | Goto | B29C 59/02 |

\* cited by examiner

*Primary Examiner* — Shamim Ahmed
(74) *Attorney, Agent, or Firm* — Wood Herron & Evans LLP

(57) ABSTRACT

Methods and systems for imprint lithography are described. In an embodiment, a method may include receiving a substrate in an imprint lithography chamber. Such a method may also include applying a deformable layer to a surface of the substrate. The method may further include injecting a gas that dissolves into the deformable layer more quickly than air into the chamber. Additionally, the method may include pressing a mold into the deformable layer. The method may also include controlling one or more processing parameters in order to achieve device formation objectives.

18 Claims, 5 Drawing Sheets

FAST IMPRINT LITHOGRAPHY

CROSS-REFERENCE SECTION

The present application claims the benefit of U.S. Provisional Patent Application No. 62/538,120, filed on Jul. 28, 2017, entitled "FAST IMPRINT LITHOGRAPHY" which is incorporated herein by reference in its entirety.

BACKGROUND OF THE INVENTION

Field of Invention

The present invention relates to systems and methods for substrate processing, and more particularly to a method and system for fast imprint lithography.

Description of Related Art

Imprint lithography is a process for small-scale device processing, including micromechanical, microelectrical, and nanoscale devices. The process includes preparing a mold as a pattern template. The mold may be arranged as a negative of the device or pattern to be formed in a deformable layer. As the mold is pressed into the deformable layer, the recesses of the mold are filled with the material of the deformable layer. The deformable layer may be cured or hardened. Once the deformable layer is hardened, the mold is removed leaving features in the hardened deformable layer.

The recesses may be filled with material from the deformable layer, but air trapped in the recesses between the mold and the deformable layer may degrade the fidelity or critical dimensions of the resulting device. In some cases, air trapped in the recesses may dissipate or absorb into the deformable layer, but the time and processing costs of waiting for the air to absorb causes significant processing inefficiencies.

SUMMARY OF THE INVENTION

Methods and systems for imprint lithography are described. In an embodiment, a method may include receiving a substrate in an imprint lithography chamber. Such a method may also include applying a deformable layer to a surface of the substrate. The method may further include injecting a gas that dissolves into the deformable layer more quickly than air into the chamber. Additionally, the method may include pressing a mold into the deformable layer. The method may also include controlling one or more processing parameters in order to achieve device formation objectives.

An embodiment of a system for imprint lithography may include an imprint lithography chamber configured to receive a substrate. The system may also include an applicator coupled to the imprint lithography chamber and configured to apply a deformable layer to a surface of the substrate. Additionally, the system may include a gas injection system coupled to the imprint lithography chamber and configured to inject a gas that dissolves into the deformable layer more quickly than air into the chamber. The system may additionally include a press configured to press a mold into the deformable layer. In such embodiments, the system may include a controller coupled to the gas injection system and to the press configured to control the at least one of a pressure applied to the mold and a gas concentration in order to achieve spacer formation objectives.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Figure 1:
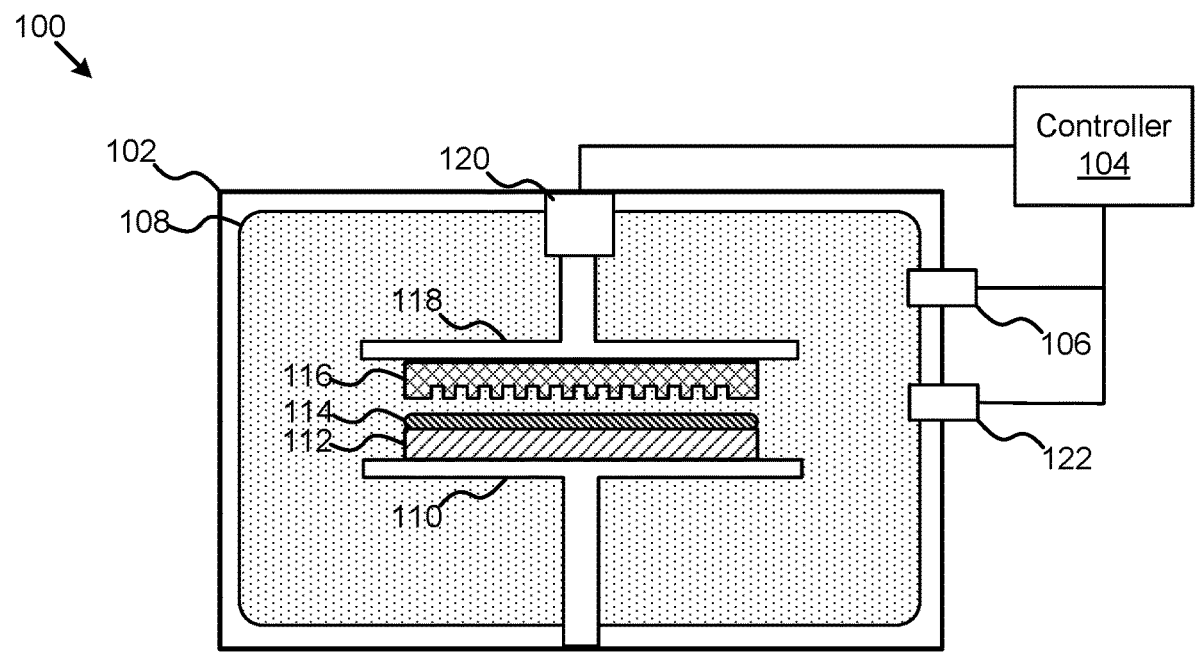
FIG. 1 illustrates one embodiment of a system for imprint lithography.

Methods and systems for imprint lithography are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Referring now to the drawings, where like reference numerals designate identical or corresponding parts throughout the several views.

FIG. 1 illustrates an embodiment of a system 100 for imprint lithography. The system 100 includes a processing chamber 102 configured to receive a substrate 112, such as a wafer. The substrate 112 may include bulk silicon, germanium, or the like. In addition, one or more intermediate layers (not shown) such as oxide layers, hard mask layers, feature layers, etc. may be included in the substrate 112. In an embodiment, a deformable layer 114 may be formed on a surface of the substrate 112.

The substrate 112 may be received by a substrate holder 110. In an embodiment, the substrate holder 110 may be a rotating chuck configured for use in applying a spin-on deformable layer material, such as photoresist. Alternatively, the substrate holder 110 may be configured to apply a force to a surface of the substrate 112 or to resist pressure applied to an opposing surface of the substrate 112 by the pressure plate 118. In an embodiment, the pressure plate 118 may be coupled to a mold 116, such as a device or pattern template. The pressure plate may be configured to press the mold 116 into the deformable layer 114 for forming one or more features in the deformable layer 114. In an embodiment, the pressure applied by the pressure plate 118 may be controlled by a pressure mechanism 120 coupled to the pressure plate 118.

In order to facilitate formation for the one or more features in the deformable layer 114, a gas 108 may be injected into the chamber 102 along a surface of the deformable layer 114. In a first embodiment, the gas 108 may be injected into the entire chamber 102. In an alternative embodiment, a controlled jet or field of gas 108 may be introduced across the surface of the deformable layer 114 that receives the mold 116. In such embodiments, the gas 108 may fill voids between the deformable layer 114 and features of the mold 116 as described in further detail with reference to FIGS. 4A-4D. The gas 108 may be injected into the chamber from a gas injection assembly 106, which may include a gas source, tubing or other gas conduit, one or more gas injection nozzles, and the like.

Various gasses 108 may be introduced, depending upon the chemistry of the deformable layer. In one embodiment, the gas 108 may be selected based upon the gasses solubility with respect to the deformable layer material. For example, fast dissolving gasses for organic solvents, such as butane, propane, R134a ($C_2F_4H_2$), $CF_4$, $CF_2H_2$, or $CO_2$ may be used with resist materials, for example. In such embodiments, the gas 108 may readily dissolve into the resist material. Additional gasses 108, such as solvent gasses including one or more of $C_xH_y$, $C_xH_yF_z$, $C_xH_yCl_z$, or $cxC_xF_yCl_z$, where x, y, and z are variable numbers, may be used in various embodiments. In such embodiments, the exact chemistry of the gas 108 may be selected in response to the solubility of the gas 108 in a particular selected deformable layer material.

Additionally, the system 100 may include a curing mechanism 122 for curing the deformable layer 114 after being imprinted with the mold 116. For example, the curing mechanism 112 may include a fan, a heater, an Ultraviolet (UV) light source, or the like. The curing mechanism 112 may cause the imprinted deformable layer 114 to harden, thereby setting the features imprinted into the deformable layer 114 by the mold 116.

The pressure mechanism 120, the gas injection assembly 106, and the curing mechanism 122 may be controlled independently, or in tandem, by the controller 104 to achieve one or more processing objectives. In addition, the controller 104 may also control other parameters within the processing chamber 102, such as the temperature, pressure, rotation of the substrate holder 110, injection of the deformable layer material, etc. Indeed, one of skill in the art will recognize a variety of additional processing parameters that may be controlled by the controller 104 to achieve one or more processing objectives.

Figure 2A:
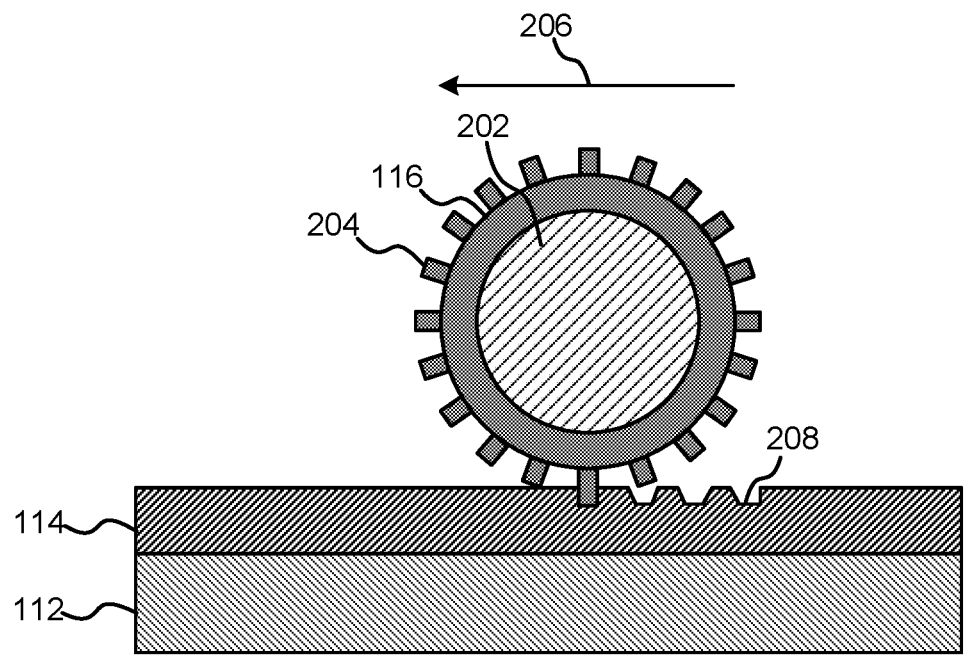
FIG. 2A illustrates one embodiment of a system for imprint lithography.
Figure 2B:
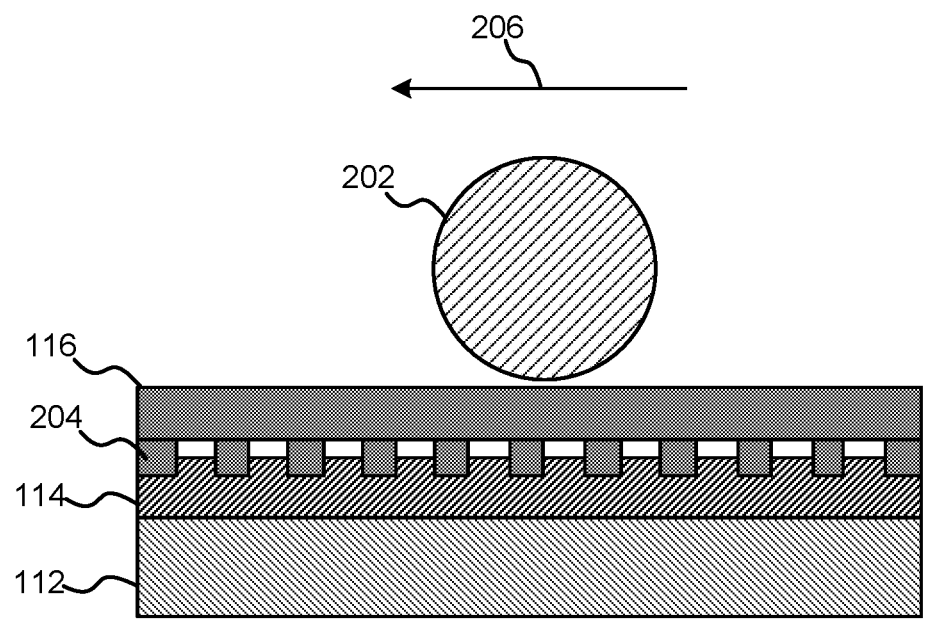
FIG. 2B illustrates one embodiment of a system for imprint lithography.

FIGS. 2A-2B illustrate alternative embodiments of imprint lithography systems. In the embodiment of FIG. 2A, the mold 116 may comprise one or more features 204 for imprinting into the deformable layer 114. The mold 116 may be formed over a roller 202, which comprises a portion of the pressure mechanism 120 and may replace the pressure plate 118. The roller 202 may roll the mold 116 along an imprint path direction 206 leaving one or more features 208 in the deformable layer 114.

In the embodiment of FIG. 2B, the mold 116 may be a plate mold or the like. The roller 202 may roll along a surface of the mold 116 and apply pressure to the mold for pressing the mold 116 into the deformable layer. Similarly, the roller 202 may roll along an imprint path direction 206. Each of the embodiments of FIGS. 2A-2B may similarly be operated in an environment containing a soluble gas 108 as described with relation to FIG. 1. One of skill in the art may recognize additional or alternative embodiments of imprint lithography machines or systems, to which the present embodiments may be suitably adapted.

FIGS. 3A-3D illustrate an embodiment of an imprint lithography process in which the solvent gas is not introduced into the environment between the mold 116 and the deformable layer 114. In such an embodiment, air 302 is trapped between features of the mold 116 and the deformable layer 114 as pressure 304 is applied to the mold 116.

Figure 3A:
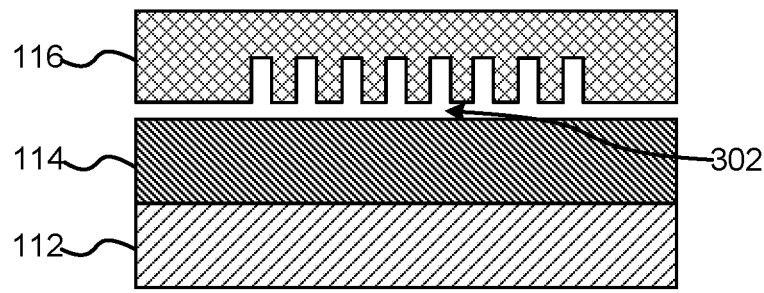
FIG. 3A illustrates one embodiment of a process for imprint lithography.
Figure 3B:
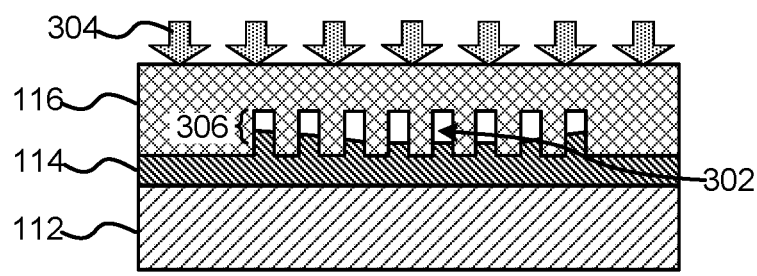
FIG. 3B illustrates one embodiment of a process for imprint lithography.

The air 302 may form gaps 306 between the mold 116 and the deformable layer 114 as shown in FIG. 3B.

The pressure 304 may be increased or maintained long enough to drive the mold 116 further into the deformable layer 114. In such a case, the gaps 306 may decrease in size, but the air 302 trapped in the gaps is just compressed. Some of the air 302 may eventually diffuse in the deformable layer 114 under certain further processing conditions, such as a timed processing pause, baking, or the like, but the air 302 does not fully diffuse and the gaps 302 remain.

When the mold 116 is removed from the deformable layer, the features 208 are left with formation inconsistencies or infidelity, such as height inconsistencies, or cross-section deformities that create problems for later processing steps, such as etching steps or further physical or chemical layer deposition steps. One of ordinary skill will recognize a variety of problems that may be introduced by the formation inconsistency of the features 208 caused by the gaps 306 of air 302.

Figure 4A:
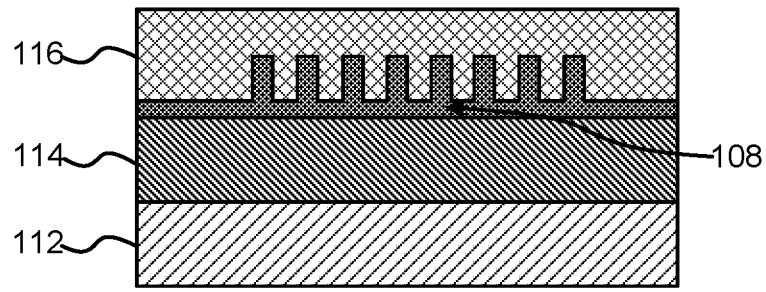
FIG. 4A illustrates one embodiment of a process for imprint lithography.

FIGS. 4A-4D illustrate process flow steps for imprint lithography. In the embodiment of FIG. 4A, gas 108 is introduced in the environment between the mold 116 and the deformable layer 114, which is formed on the substrate 112. In an embodiment, the gas dissolves more quickly into the material of the deformable layer than air. For example, the gas may be a solvent gas-such as an organic solvent-which dissolves more readily into an organic deformable layer, such as resist or PMMA.

Figure 3C:
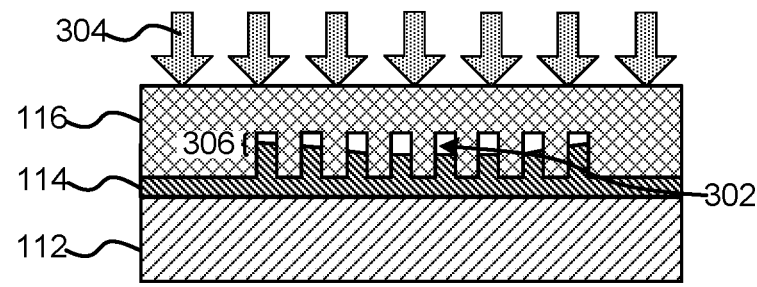
FIG. 3C illustrates one embodiment of a process for imprint lithography.
Figure 3D:
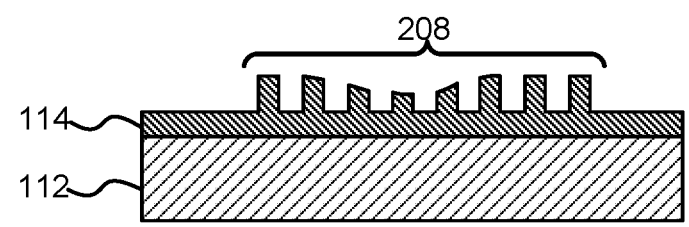
FIG. 3D illustrates one embodiment of a process for imprint lithography.
Figure 4B:
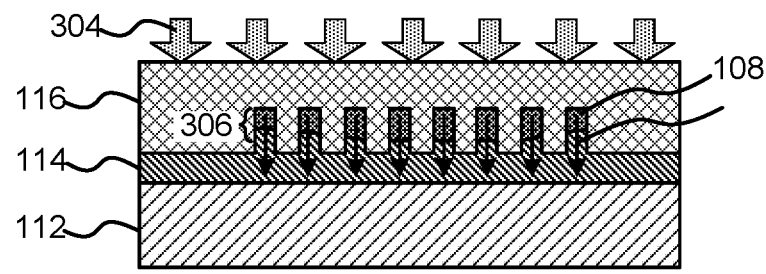
FIG. 4B illustrates one embodiment of a process for imprint lithography.
Figure 4C:
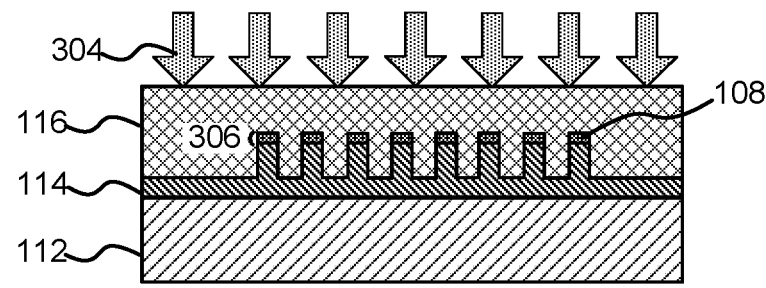
FIG. 4C illustrates one embodiment of a process for imprint lithography.
Figure 4D:
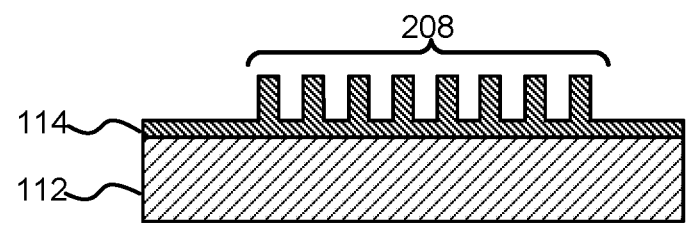
FIG. 4D illustrates one embodiment of a process for imprint lithography.

As shown in FIG. 4B, the gas 108 may fill the gaps 306 formed between the deformable layer 114 and the mold 116 as the mold is pressed with pressure 304 into the deformable layer 114. As the pressure 304 is maintained or increased as shown in FIG. 4C, the gap 306 is significantly reduced in size and more uniform with respect to the various features in the mold as compared to the gaps shown in FIG. 3C that include air 302. In some embodiments, the solvent gas 108 may dissolve or diffuse into the material of the deformable layer 114. In such embodiments, the gaps 306 may be smaller and more uniform than the gaps formed by air 302 as shown in FIG. 3C. The features 208 formed by the process of FIGS. 4A-4D may be more uniform in height and profile than the features 208 formed by the process described in FIGS. 3A-3D, which is illustrated in FIG. 4D.

In certain further embodiments, additional processing steps may be included. For example, the deformable layer 114 may be hardened in an additional step. In such an embodiment, the hardening may be performed by UV exposure. A further processing step may include opening of portions of the deformable layer 114 by etch processes, including wet or dry etching techniques. Chemical or physical layers may be formed on surfaces of the deformable layer 114 as well. One of ordinary skill will recognize further processing steps that may be performed in combination with the imprint lithography processes described herein.

Figure 5:
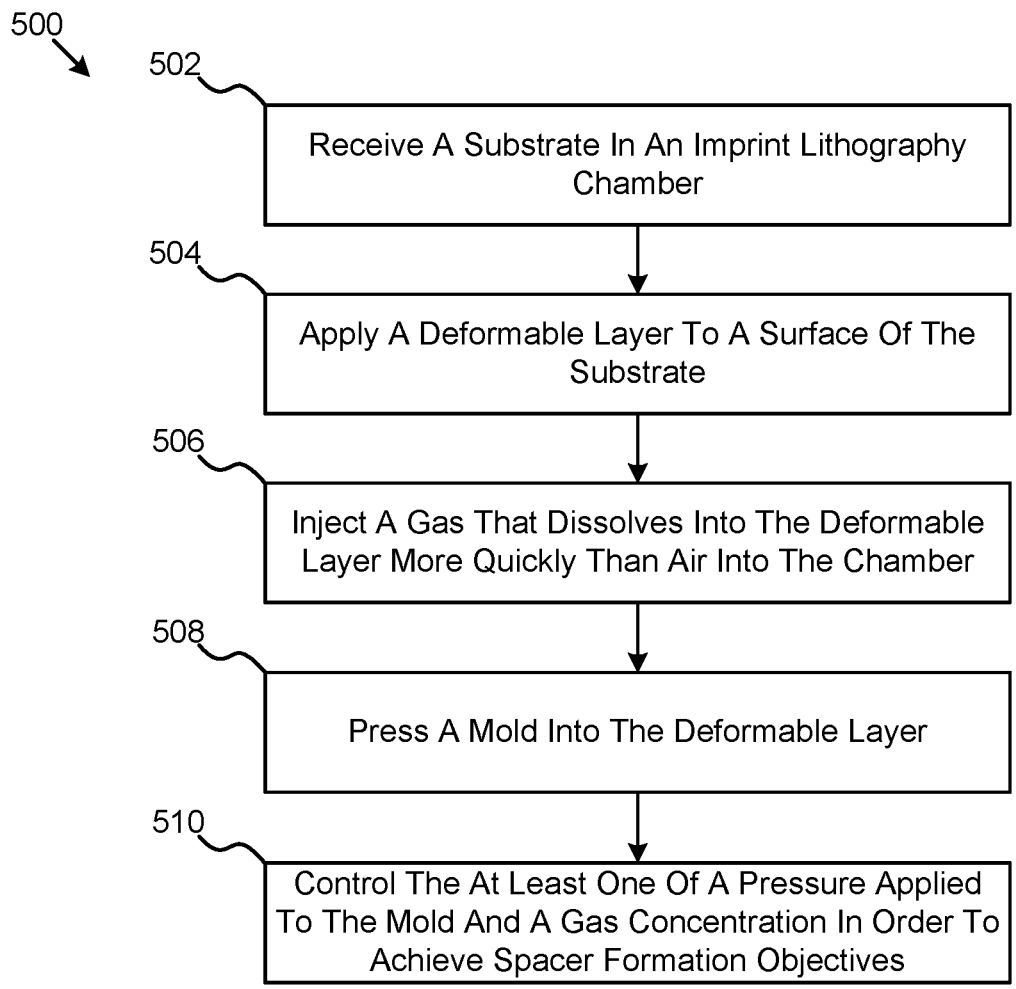
FIG. 5 illustrates one embodiment of a method for imprint lithography.

FIG. 5 illustrates an embodiment of a method 500 for imprint lithography. In an embodiment, the method 500 may include receiving a substrate 112 in an imprint lithography chamber 102 as shown at block 502. Such a method 500 may also include applying a deformable layer 114 to a surface of the substrate 112 as shown at block 504. The method 500 may further include injecting a gas 108 that dissolves into the deformable layer 114 more quickly than air 302 into the chamber 102 as shown at block 506. Additionally, the method 500 may include pressing a mold 116 into the deformable layer 114 as shown at block 508. The method 500 may also include controlling one or more processing parameters in order to achieve device formation objectives as shown at block 510.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

I claim:

1. A method for imprint lithography comprising:
receiving a substrate in an imprint lithography chamber;
applying a deformable layer to a surface of the substrate;
injecting a gas between the deformable layer and a mold;
pressing the mold into the deformable layer, wherein only the gas, in its gaseous state, dissolves directly into the deformable layer, and dissolves more quickly than air into the chamber; and
controlling one or more processing parameters in order to achieve device formation objectives,
wherein the gas is organic and selected from a group consisting of $C_xF_y$, $C_xF_yH_z$, $CO_2$, R134a, $C_xH_y$, $C_xH_yF_z$, $C_xH_yCl_z$, and $C_xF_yCl_z$ where x, y, and z are integers.

2. The method of claim 1, wherein the deformable layer is an organic layer.

3. The method of claim 2, wherein the organic layer is photoresist.

4. The method of claim 1, wherein the deformable layer is Poly(methyl methacrylate) (PMMA).

5. The method of claim 1, wherein the mold comprises a template for a device to be imprinted into the deformable layer.

6. The method of claim 1, wherein the gas is injected into the entire chamber.

7. The method of claim 1, wherein the gas is injected along a surface of the deformable layer.

8. The method of claim 1, wherein controlling the one or more processing parameters includes controlling a pressure applied to the mold.

9. The method of claim 1, wherein controlling the one or more processing parameters includes controlling a gas concentration at a surface of the deformable layer.

10. The method of claim 1, wherein controlling the one or more processing parameters includes controlling a pressure applied to the mold and a gas concentration at a surface of the deformable layer.

11. The method of claim 1, further comprising hardening the deformable layer after the deformable layer has been imprinted by the mold.

12. The method of claim 11, wherein hardening the deformable layer further comprises exposing the deformable layer to ultraviolet light.

13. The method of claim 1, further comprising etching the deformable layer using one or more of a wet etch process and a dry etch process.

14. The method of claim 1, wherein pressing a mold into the deformable layer further comprises applying a normal force to a surface of the mold.

15. The method of claim 1, wherein pressing a mold into the deformable layer further comprises applying a rolling force across a surface of the mold.

16. The method of claim 1, wherein pressing a mold into the deformable layer further comprises rolling the mold across a surface of the deformable layer.

17. The method of claim 1, wherein the device formation objectives include uniformity of height and profile of features in the deformable layer.

18. A method for imprint lithography comprising:
- receiving a substrate in an imprint lithography chamber;
- applying a deformable layer to a surface of the substrate;
- filling a gap in a mold with a gas that dissolves into the deformable layer more quickly than air into the chamber;
- pressing the mold into the deformable layer, wherein only the gas, in its gaseous state, dissolves directly into the deformable layer and dissolves more quickly than air into the chamber; and
- controlling one or more processing parameters in order to achieve device formation objectives,
- wherein the gas is organic and selected from a group consisting of $C_xF_y$, $C_xF_yH_z$, $CO_2$, R134a, $C_xH_y$, $C_xH_yF_z$, $C_xH_yCl_z$, and $C_xF_yCl_z$ where x, y, and z are integers.

* * * * *